United States Patent
Ban et al.

(10) Patent No.: US 10,135,545 B2
(45) Date of Patent: Nov. 20, 2018

(54) OPTICAL RECEIVER MODULE AND OPTICAL MODULE

(71) Applicant: Oclaro Japan, Inc., Sagamihara, Kanagawa (JP)

(72) Inventors: Takuma Ban, Kanagawa (JP); Kazuhiro Komatsu, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/624,739

(22) Filed: Jun. 16, 2017

(65) Prior Publication Data

US 2017/0366277 A1    Dec. 21, 2017

(30) Foreign Application Priority Data

Jun. 20, 2016    (JP) .................. 2016-121475
May 10, 2017    (JP) .................. 2017-093848

(51) Int. Cl.
| | |
|---|---|
| H04B 10/60 | (2013.01) |
| H04B 10/69 | (2013.01) |
| H01L 31/02 | (2006.01) |
| H01L 25/16 | (2006.01) |
| H01L 31/16 | (2006.01) |
| H04B 10/40 | (2013.01) |

(52) U.S. Cl.
CPC ......... *H04B 10/697* (2013.01); *H01L 25/167* (2013.01); *H01L 31/02005* (2013.01); *H01L 31/02019* (2013.01); *H01L 31/165* (2013.01); *H04B 10/40* (2013.01); *H04B 10/60* (2013.01)

(58) Field of Classification Search
CPC ...... H04B 10/697; H04B 10/40; H04B 10/60; H01L 31/02019; H01L 25/167; H01L 31/165; H01L 31/02005

USPC .................................................. 398/202–214
See application file for complete search history.

(56) References Cited

U.S. PATENT DOCUMENTS

| | | | | |
|---|---|---|---|---|
| 5,459,284 A | * | 10/1995 | Bockelman | H01L 24/49 174/34 |
| 5,471,010 A | * | 11/1995 | Bockelman | H01L 24/48 174/34 |
| 5,776,786 A | * | 7/1998 | Nakamura | B23K 20/007 257/E21.509 |
| 6,441,501 B1 | * | 8/2002 | Tseng | H01L 21/565 257/784 |

(Continued)

FOREIGN PATENT DOCUMENTS

JP    2014-192510 A    10/2014

*Primary Examiner* — Ken N Vanderpuye
*Assistant Examiner* — Dibson Sanchez
(74) *Attorney, Agent, or Firm* — Mattingly & Malur, PC

(57) ABSTRACT

An optical receiver module includes a light receiving element that has a first electrode and a second electrode for receiving a bias and converts an optical signal inputted into an electrical signal to output the electrical signal via the first electrode. A signal line extends from the first electrode through the light receiving element-side signal pad and the second wire to the amplifier-side signal pad. A bias line extends from the second electrode through the light receiving element-side bias pad, the first wire, and the third wire to the first and second amplifier-side bias pads. The signal line three-dimensionally intersects with the bias line at an interval in a direction of the loop height of the first wire and that of the second wire.

7 Claims, 9 Drawing Sheets

(56) References Cited

U.S. PATENT DOCUMENTS

| | | | | |
|---|---|---|---|---|
| 6,586,309 | B1* | 7/2003 | Yeo | H01L 23/5227 257/531 |
| 6,684,032 | B1* | 1/2004 | Umeda | H04B 10/695 398/202 |
| 6,781,108 | B2* | 8/2004 | Fujino | H01L 25/167 250/214 A |
| 6,894,398 | B2* | 5/2005 | Pon | H01L 24/43 257/723 |
| 6,933,223 | B1* | 8/2005 | Soon | B23K 20/004 438/617 |
| 7,148,567 | B2* | 12/2006 | Moriguchi | H01L 23/49575 257/723 |
| 7,994,437 | B2* | 8/2011 | Fukuda | H01L 23/50 257/777 |
| 9,163,982 | B2* | 10/2015 | Takechi | G01J 1/46 |
| 9,172,335 | B2* | 10/2015 | Ueno | H04B 10/60 |
| 2003/0081297 | A1* | 5/2003 | Hasegawa | G02B 6/4201 398/202 |
| 2004/0022544 | A1* | 2/2004 | Case | H04B 10/40 398/137 |
| 2004/0188793 | A1* | 9/2004 | Lindemann | H01L 27/1463 257/457 |
| 2005/0189643 | A1* | 9/2005 | Zhou | H01L 23/49838 257/690 |
| 2007/0128821 | A1* | 6/2007 | Lee | H01F 19/04 257/531 |
| 2007/0182026 | A1* | 8/2007 | Nishiura | H01L 24/49 257/784 |
| 2009/0189059 | A1* | 7/2009 | Smith | G01J 1/02 359/337 |
| 2010/0172609 | A1* | 7/2010 | Rolston | H01S 5/02276 385/14 |
| 2010/0213566 | A1* | 8/2010 | Ho | H01L 24/49 257/459 |
| 2012/0057261 | A1* | 3/2012 | Poulton | H04B 3/54 361/56 |
| 2012/0170944 | A1* | 7/2012 | Yagisawa | H04B 10/6911 398/200 |
| 2013/0294766 | A1* | 11/2013 | Cai | H04B 10/07953 398/26 |
| 2014/0112625 | A1* | 4/2014 | Cole | H04B 10/40 385/88 |
| 2015/0069220 | A1* | 3/2015 | Yagisawa | H03F 3/08 250/214 A |
| 2015/0270814 | A1 | 9/2015 | Ban et al. | |
| 2016/0149643 | A1* | 5/2016 | Kasai | G02B 6/00 398/79 |
| 2016/0245691 | A1* | 8/2016 | Suzuki | H03F 3/08 |
| 2017/0040305 | A1* | 2/2017 | Kugiyama | H01L 31/167 |
| 2017/0075081 | A1* | 3/2017 | Luk | G02B 6/4225 |

* cited by examiner

OPTICAL RECEIVER MODULE AND OPTICAL MODULE

CROSS-REFERENCE TO RELATED APPLICATION

The present application claims priority from Japanese application JP2016-121475 filed on Jun. 20, 2016 and JP2017-093848 filed on May 10, 2017, the content of which is hereby incorporated by reference into this application.

BACKGROUND OF THE INVENTION

1. Field of the Invention

The present invention relates to an optical receiver module and an optical module.

2. Description of the Related Art

In recent years, demands for optical modules for high speed communication have been increasing. An optical receiver module for a transmission speed of about 10 Gbps has a shape of a coaxial type package or a box type package. In the package, a light receiving element and an amplifier (such as a trans-impedance amplifier and an automatic gain control amplifier) are disposed close to each other, and electrode pads are connected to one another by wires. The package has a lens as well. When an optical signal is inputted through an optical fiber, the beam spot of the optical signal is stopped down through the lens, and the optical signal is converted into an electrical signal through photoelectric conversion in an absorber layer (an optical receiver unit) of the light receiving element. An electrical signal, which is usually very subtle as being of a few microamperes to a few milliamperes, is amplified by the amplifier before being outputted as a voltage signal.

The amplifier receives a supply of power from a power source outside the package, and a bias is applied to the light receiving element. A high speed optical receiver module adapted to a speed of 10 Gbps or faster is designed such that a power line runs through an electrode pad having a plate capacitor and a chip capacitor, for example, in the package in order to prevent noise generation and signal deterioration due to oscillation or other causes. The inside and outside of the package are electrically connected to each other by a lead pin on the package or a transmission line pattern or the like on the ceramic substrate.

Japanese Patent Laid-open Publication No. 2014-192510 discloses an optical receiver module in which a bias to a light receiving element passes through a wire from an amplifier, and a signal from the light receiving element is outputted through a wire to the amplifier. As these wires are aligned in parallel with each other, crosstalk due to electrostatic induction and electromagnetic induction deteriorates signal transmission characteristics in a high-speed operation. In particular, varying the voltage of a power source will cause noise, and signal quality is thereby deteriorated.

SUMMARY OF THE INVENTION

It is an object of the present invention to reduce noise generation to thereby achieve high quality transmission characteristics.

(1) An optical receiver module according to the present invention includes a light receiving element having a first electrode and a second electrode for receiving a bias, the light receiving element for converting an optical signal inputted into an electrical signal to output the electrical signal via the first electrode; a light receiving element-side signal pad electrically connected to the first electrode of the light receiving element; a light receiving element-side bias pad electrically connected to the second electrode of the light receiving element; an amplifier for supplying a voltage to apply the bias to the light receiving element and amplifying the electrical signal inputted from the light receiving element; a first amplifier-side bias pad and a second amplifier-side bias pad where the voltage appears; an amplifier-side signal pad for inputting the electrical signal to the amplifier; a first wire connecting the light receiving element-side bias pad and the first amplifier-side bias pad through wire bonding; a second wire connecting the light receiving element-side signal pad and the amplifier-side signal pad through wire bonding; and a third wire connecting the light receiving element-side bias pad and the second amplifier-side bias pad through wire bonding; wherein the optical receiver module further includes a signal line extending from the first electrode through the light receiving element-side signal pad and the second wire to the amplifier-side signal pad, and a bias line extending from the second electrode through the light receiving element-side bias pad, the first wire, and the third wire to the first amplifier-side bias pad and the second amplifier-side bias pad, and the signal line three-dimensionally intersects with the bias line at an interval in a direction of a loop height of the first wire and a loop height of the second wire. According to the present invention, three-dimensional intersection between the signal line and the bias line can reduce influence of crosstalk, and noise is thereby reduced. This can achieve high quality transmission characteristic.

(2) In the optical receiver module according to (1), the amplifier-side signal pad may be positioned between the first amplifier-side bias pad and the second amplifier-side bias pad, and the light receiving element-side bias pad may be positioned closer to, and adjacent to, the second amplifier-side bias pad than the first amplifier-side bias pad.

(3) In the optical receiver module according to (2), the third wire may three-dimensionally intersect with neither the first wire nor the second wire in the direction of the loop height.

(4) In the optical receiver module according to any one of (1) to (3), the light receiving element-side bias pad, the light receiving element-side signal pad, the first amplifier-side bias pad, the second amplifier-side bias pad, and the amplifier-side signal pad may have respective bonding surfaces for bonding to the first wire or the second wire and the third wired, and the bonding surfaces may all face in a same direction.

(5) In the optical receiver module according to (4), the direction in which the bonding surface faces may coincide with the direction of the loop height.

(6) The optical receiver module according to any one of (1) to (5) may further include a carrier for supporting the light receiving element, the carrier may have a wiring pattern electrically connected to the light receiving element, and the wiring pattern may include the light receiving element-side bias pad and the light receiving element-side signal pad.

(7) In the optical receiver module according to (6), the carrier may have a first surface facing in a first direction and a second surface facing in a second direction, different from the first surface, and the wiring pattern may extend from the first surface to the second surface, and include the light receiving element-side bias pad and the light receiving element-side signal pad both mounted on the first surface, and an electrical connection portion mounted on the second surface, for electrical connection to the light receiving element.

(8) In the optical receiver module according to any one of (1) to (5), the light receiving element-side bias pad and the light receiving element-side signal pad may be mounted directly on the light receiving element.

(9) In the optical receiver module according to any one of (1) to (8), the first wire may three-dimensionally intersect with the second wire.

(10) In the optical receiver module according to any one of (1) to (8), one of the first wire and the second wire may three-dimensionally intersect with a part of the other to which the one is electrically connected.

(11) In the optical receiver module according to any one of (1) to (8), the first wire may three-dimensionally intersect with a part extending between the first electrode and the light receiving element-side signal pad.

(12) An optical module according to the present invention includes a receiver optical sub-assembly having the optical receiver module according to any one of (1) to (11), and a transmitter optical sub-assembly for converting an electrical signal inputted into an optical signal to output the optical signal.

DETAILED DESCRIPTION OF THE INVENTION

Figure 1:
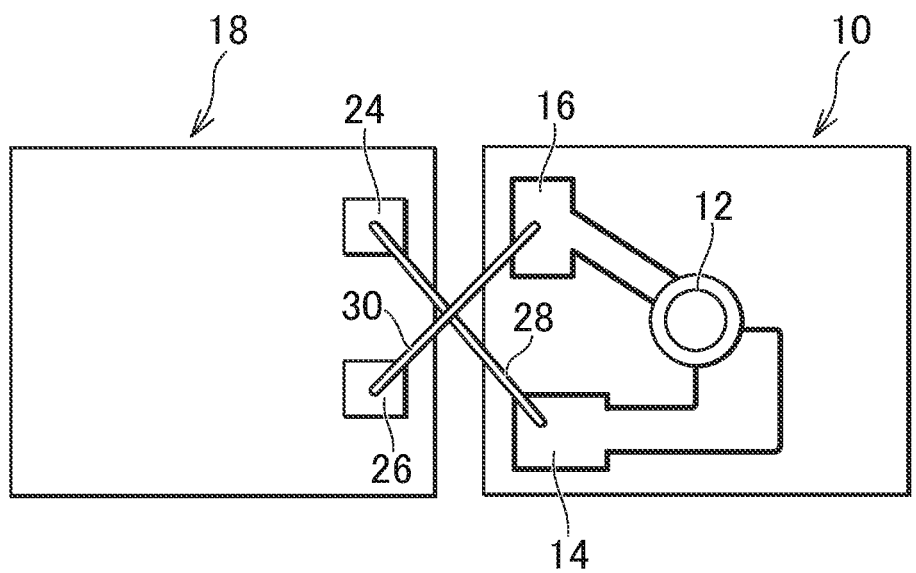
FIG. 1 is a plan view of an optical receiver module according to a first reference example of the present invention.

The following describes embodiments of the present invention with reference to the drawings. Identical or similar components will be given the same reference numerals in the drawings, and a duplicate description is avoided.

[First Reference Example]

Figure 2:
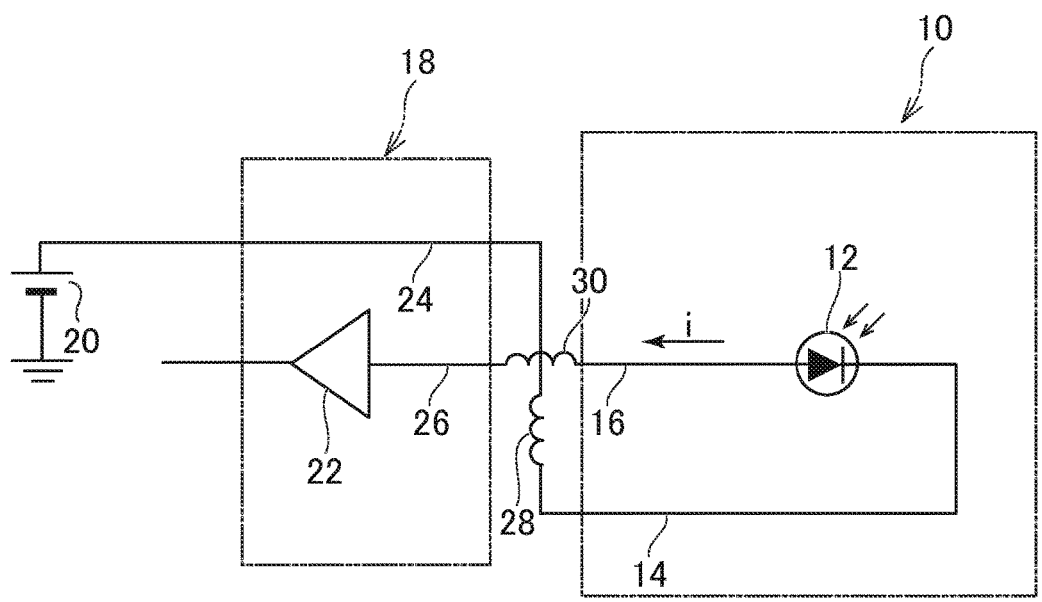
FIG. 2 illustrates a circuit of the optical receiver module illustrated in FIG. 1.

FIG. 1 is a plan view of an optical receiver module according to a first reference example of the present invention. FIG. 2 illustrates a circuit of the optical receiver module illustrated in FIG. 1.

The optical receiver module includes a light receiving element 10 (for example, a photodiode). The light receiving element 10 includes an optical receiver unit 12. The optical receiver unit 12 includes a cathode and an anode as illustrated in FIG. 2. The cathode and anode receive an input of a bias. An optical signal is inputted into the optical receiver unit 12, and then converted into an electrical signal. The electrical signal (a current i) is outputted from the anode. The light receiving element 10 is a semiconductor device having a PN junction. Assume here that the side of the light receiving element 10 connected to the p-type semiconductor is referred to as an anode, while the side of the same connected to the n-type semiconductor as a cathode. Differently, the side of the light receiving element 10 on the p-type semiconductor side may be referred to as a signal electrode, while the side of the same on the n-type semiconductor side as a bias electrode. These names, namely, an anode and a cathode, are for a convenience purpose, and may be used in a converse way. That is, these names, namely, an anode and a cathode, indicate that the light receiving element 10 has two electrodes (a first electrode and a second electrode) having different polarities. In this reference example, a positive voltage is applied to an electrode connected to the n-type semiconductor (a reverse bias state). Although light receiving elements of many semiconductors in use receive an input of a bias voltage in the same direction as that in this reference example, the positive-negative direction of a voltage may be desirably selected depending on a light receiving element in use without limitation.

The light receiving element 10 is electrically connected, via the cathode thereof, to a cathode pad (a light receiving element-side bias pad) 14, and, via the anode thereof, to an anode pad (a light receiving element-side signal pad) 16. The cathode pad 14 and anode pad 16 are mounted directly on the light receiving element 10. Specifically, the cathode pad 14 and anode pad 16 are mounted on the same surface of the light receiving element 10, and face in the same direction.

The optical receiver module includes an amplifier 18 such as a trans-impedance amplifier. The amplifier 18 receives power from an external power source 20 (FIG. 2). The amplifier 18 supplies a voltage for applying a bias to the light receiving element 10. This voltage as well is supplied from the external power source 20. The amplifier 18 has an amplifying circuit 22 (for example, an operational amplifier), and amplifies an electrical signal (a current i) inputted from the light receiving element 10. The light receiving element 10 and the amplifier 18 may be connected to different power supplies 20.

The amplifier 18 has a pair of pads (an amplifier-side bias pad 24 and an amplifier-side signal pad 26) where a voltage for supplying a bias to the light receiving element 10 appears. The amplifier-side signal pad 26 is used to input an electrical signal to the amplifier 18. The amplifier-side bias pad 24 and the amplifier-side signal pad 26 are mounted directly on the amplifier 18. The amplifier-side bias pad 24 and the amplifier-side signal pad 26 are mounded on the same surface of the amplifier 18, and face in the same direction. The direction in which the amplifier-side bias pad 24 and the amplifier-side signal pad 26 face is the same as the direction in which the cathode pad 14 and the anode pad 16 face.

The cathode pad 14 is connected to the amplifier-side bias pad 24 by a first wire 28 through wire bonding, or one type of an electrical connection method. Similarly, the anode pad 16 is connected to the amplifier-side signal pad 26 by a second wire 30 through wire bonding. With wire bonding employed, each of the first wire 28 and the second wire 30 forms a loop. In the example illustrated in FIG. 1, the first wire 28 and the second wire 30 have loop heights in the same direction (toward the front surface side of the paper). A loop height will be defined in the first embodiment.

The cathode pad 14 and the amplifier-side bias pad 24, and the anode pad 16 and the amplifier-side signal pad 26 have bonding surfaces for bonding to the first wire 28 and the second wire 30, respectively. The bonding surfaces all face in the same direction. The direction in which the bonding surfaces face coincides with the direction of the loop height.

The cathode pad 14 is positioned closer to, and adjacent to, the amplifier-side signal pad 26 than the amplifier-side bias pad 24. That is, the cathode pad 14 is apart from the amplifier-side bias pad 24. Meanwhile, the anode pad 16 is positioned closer to, and adjacent to, the amplifier-side bias pad 24 than the amplifier-side signal pad 26. That is, the anode pad 16 is apart from the amplifier-side signal pad 26.

Thus, the first wire 28 three-dimensionally intersects at an interval with the second wire 30 in the direction of the loop height. In other words, the first wire 28 and the second wire 30 appear intersecting with each other when viewed along the direction of the loop height as illustrated in FIG. 1.

According to the reference example, the three-dimensional intersection between the first wire 28 and the second wire 30 can reduce influence of crosstalk. The reduction in crosstalk influence can reduce noise, and thus achieve high quality transmission characteristics.

[First Embodiment]

Figure 3:
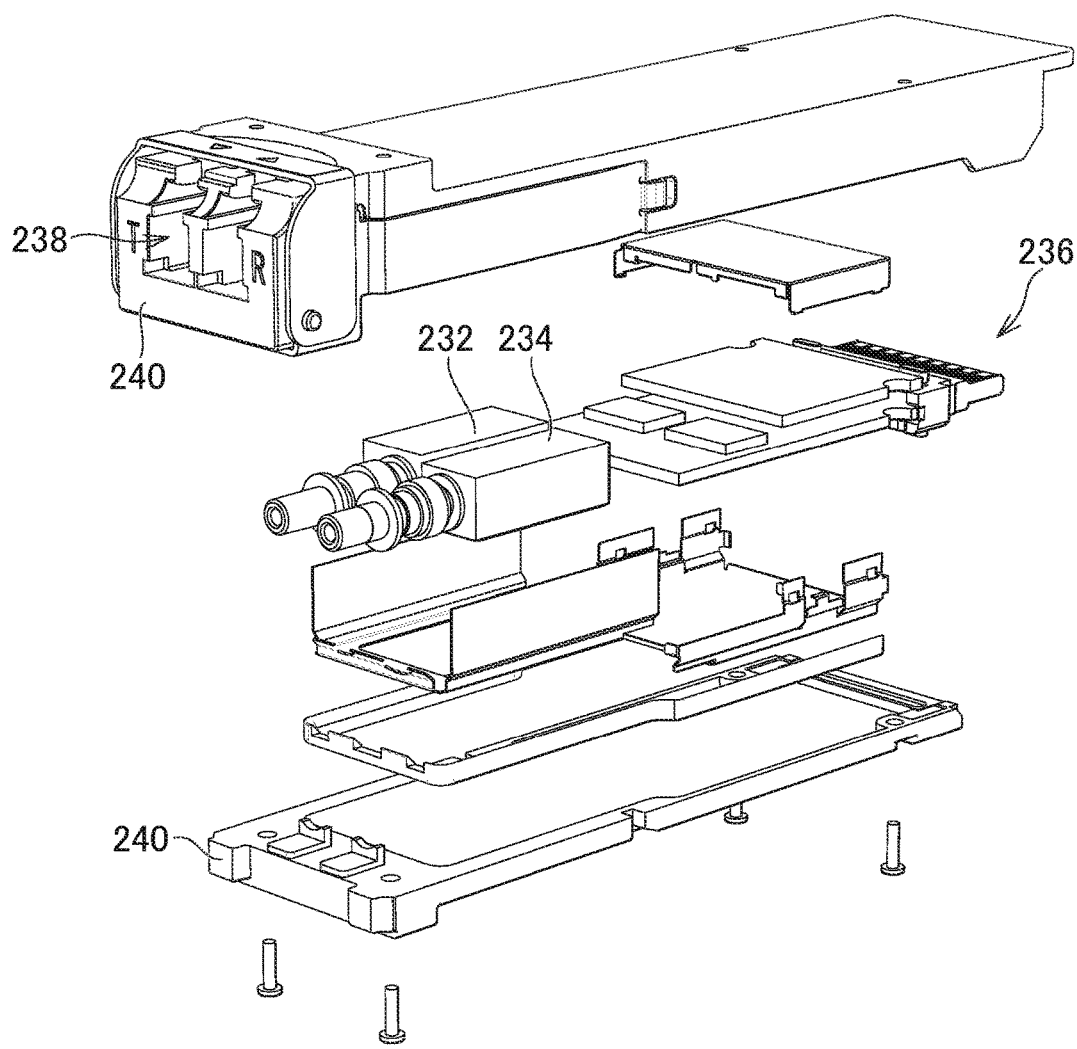
FIG. 3 is an exploded perspective view of an optical module according to the first embodiment to which the present invention is applied.

FIG. 3 is an exploded perspective view of an optical module according to a first embodiment to which the present invention is applied. An optical module has a transmitter optical sub-assembly (TOSA) 232 for converting an electrical signal into an optical signal, and a receiver optical sub-assembly (ROSA) 234 for converting an optical signal to an electrical signal. On the transmitter side, a signal from a host substrate (not shown) is supplied via an electric interface 236 into a circuit in the optical module before being converted into an optical signal. The optical signal is sent from an optical interface 238. Meanwhile, on the receiving side, an optical signal is received, and an electrical signal is outputted to a host-side substrate (not shown). The optical module has a case 240 including a pair of half-cases with electronic components therein.

Figure 4:
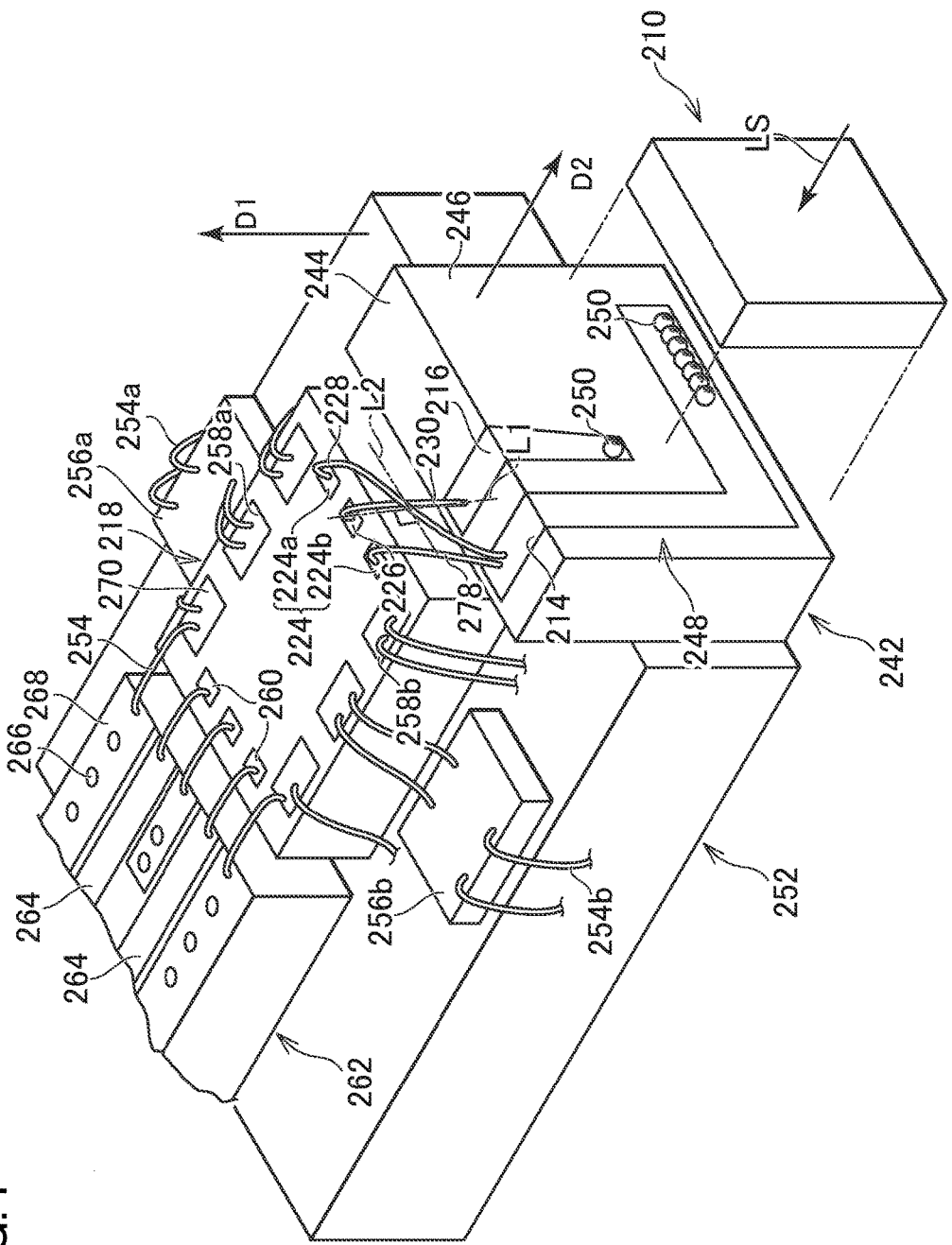
FIG. 4 is a partially exploded perspective view of an optical receiver module stored in the optical module illustrated in FIG. 3.

FIG. 4 is a partially exploded perspective view of an optical receiver module in the optical module illustrated in FIG. 3. In detail, the optical receiver module is accommodated in the receiver optical sub-assembly 234 illustrated in FIG. 3.

The optical receiver module has a light receiving element 210. The light receiving element 210 receives an input of an optical signal LS having passed through a fiber core layer of an optical fiber (not shown) and been condensed by a lens (not shown). The light receiving element 210 is a rear surface light receiving element that receives an optical signal LS via a surface thereof opposite from the surface thereof with a circuit thereon.

The light receiving element 210 is supported by a carrier 242. The carrier 242 has a first surface 244 facing in a first direction D1 and a second surface 246 facing in a second direction D2, different from the first surface 244. In this example, the first direction D1 is perpendicular to the second direction D2. The carrier 242 has a wiring pattern 248 extending from the first surface 244 to the second surface 246. The wiring pattern 248 has a cathode pad 214 and an anode pad 216 on the first surface 244 thereof. The light receiving element 210 is mounted on the second surface 246 of the carrier 242. The wiring pattern 248 has an electrical connection portion on the second surface 246 to electrically connect to the light receiving element 210. The light receiving element 210 is electrically and mechanically connected to the wiring pattern 248 through soldering 250. The light receiving element 210 is electrically connected, via the cathode thereof, to the cathode pad 214 and, via the anode thereof, to the anode pad 216, as described in the first reference example.

An amplifier 218 (for example, a preamplifier, a limiting amplifier, an auto-gain controller, or a trans-impedance amplifier) is mounted on a substrate 252. An amplifier-side bias pad 224 includes a first amplifier-side bias pad 224a and a second amplifier-side bias pad 224b. An amplifier-side signal pad 226 is positioned between the first amplifier-side bias pad 224a and the second amplifier-side bias pad 224b. The cathode pad 214 is positioned closer to, and adjacent to, the second amplifier-side bias pad 224b than the first amplifier-side bias pad 224a. The first amplifier-side bias pad 224a is positioned farther from the cathode pad 214 than the amplifier-side signal pad 226. The anode pad 216 is positioned adjacent to the amplifier-side signal pad 226.

A first wire 228 connects the cathode pad 214 and the first amplifier-side bias pad 224a through wire bonding. A second wire 230 connects the anode pad 216 and the amplifier-side signal pad 226 through wire bonding. The first wire 228 three-dimensionally intersects with the second wire 230 at an interval in the direction of the loop height.

Note here that the "direction of a loop height" refers to the direction along (parallel to) the normal L2 extending from any one point at the middle (except both ends) of a wire to the straight line L1 connecting the two ends of the wire. When viewed along the direction of the loop height of the first wire 228 and that of the second wire 230 as well, the first wire 228 three dimensionally intersects with the second wire 230. The direction of the loop height of the first wire 228 may coincide with, be in parallel with, or intersect with that of the second wire 230. The contents on the loop height are applied to other embodiments.

A third wire 278, although connecting the cathode pad 214 and the second amplifier-side bias pad 224b through wire bonding, does not three-dimensionally intersect, when viewed along the direction of the loop height of either the first wire 228 or the second wire 230.

This embodiment is characterized in the manner of wire connection between the amplifier 218 having three terminals (the amplifier-side signal pad 226, the first amplifier-side bias pad 224a, and the second amplifier-side bias pad 224b) and the carrier 242 having two terminals (the anode pad 216 and the cathode pad 214). As an amplifier amplifies subtle electricity subjected to high speed modulation, a signal line is less affected by outside noise and obtains stable characteristics when being disposed between bias lines, that is, when having a structure of a coplanar line. This is true to a wire inside the amplifier. That is, an amplifier having three terminals can likely obtain an electrical signal in higher quality, as compared with an amplifier having two terminals described in the first reference example. Similarly, a pad of a carrier having the light receiving element 210 thereon and a wire pattern connected to the pad as well have higher tolerance to outside noise when the pad and the wire pattern are formed using a coplanar line (including a grounded coplanar line). The need of a space for three terminals, however, may enlarge the carrier size. A larger area occupied by a wire pattern leads to a disadvantageous increase in capacitance component of the carrier itself. The capacitance component may likely hinder the capability to respond at high speed. Meanwhile, the carrier having two terminals employed in this embodiment can reduce the size of the carrier and capacitance component, as compared with a carrier with three terminals, thus being superior in cost reduction and capability to respond at high speed. Moreover, a carrier having two terminals, although being slightly inferior in tolerance to outside noise, uses a shorter wiring pattern so that a range subject to influence of outside noise can thereby be minimized. In view of the above, combination of the amplifier 218 having three terminals and the carrier 242 having two terminals can achieve a carrier superior, as a whole, in high frequency characteristics and capability to respond at high speed.

In the above described manner of wire bonding between the amplifier 218 and the carrier 242 as illustrated in shown in FIG. 4, the three-dimensional intersection between the first wire 228 and the second wire 230 can reduce crosstalk influence. The reduced crosstalk influence can reduce noise, and achieve high speed transmission characteristic. Further, bonding the first wire 228 and the third wire 278 to the same pad (the cathode pad 214) on the carrier side, although to different bias pads on the amplifier side, can avoid parallel alignment of the first wire 228 and the third wire 278. This can reduce mutual inductance between the two wires, and thus prevent deterioration in high frequency characteristics. Yet further, disposition of the third wire 278 next to the second wire 230, or a signal line, improves tolerance to outside noise, as compared with the first reference example, as a wire in the state of being alone is vulnerable to outside influence.

An optical signal LS inputted into the light receiving element 210 is converted into an electrical signal. The electrical signal is sent from the light receiving element 210 through the anode pad 216, the second wire 230, and the amplifier-side signal pad 226 to be inputted to the amplifying circuit (not shown) of the amplifier 218.

Power to the amplifier 218 is supplied through an external power supply line (not shown), a wire 254a, a plate capacitor 256a, and a power source pad 258a to the signal amplifying circuit (not shown) of the amplifier 218.

The light receiving element 210 receives power from the amplifier 218 to apply a bias. For example, power is supplied through the external power supply line (not shown), a wire 254b, and a plate capacitor 256b to a power source pad 258b of the amplifier 218. The power thereafter passes through a bias power line (not shown) patterned on the amplifier 218 to be supplied into the first amplifier-side bias pad 224a and the second amplifier-side bias pad 224b. The power further passes through the first wire 228 and the third wire 278 respectively connected to the first amplifier-side bias pad 224a and the second amplifier-side bias pad 224b to be supplied to the light receiving element 210. Alternatively, power to be supplied to the amplifier 218 may be supplied also to the light receiving element 210.

The amplifier 218 amplifies an electrical signal inputted from the amplifier-side signal pad 226, and outputs to the output pad 260. The amplifier 218 has a pair of output pads 260 for differential output. A differential output electrical signal passes through a signal pattern 264 on the wiring substrate 262 before being outputted to outside. A GND pattern 268 having a through-hole 266 is formed on the wiring substrate 262 and connected by a wire 254 to the GND pad 270 of the amplifier 218.

Figure 5:
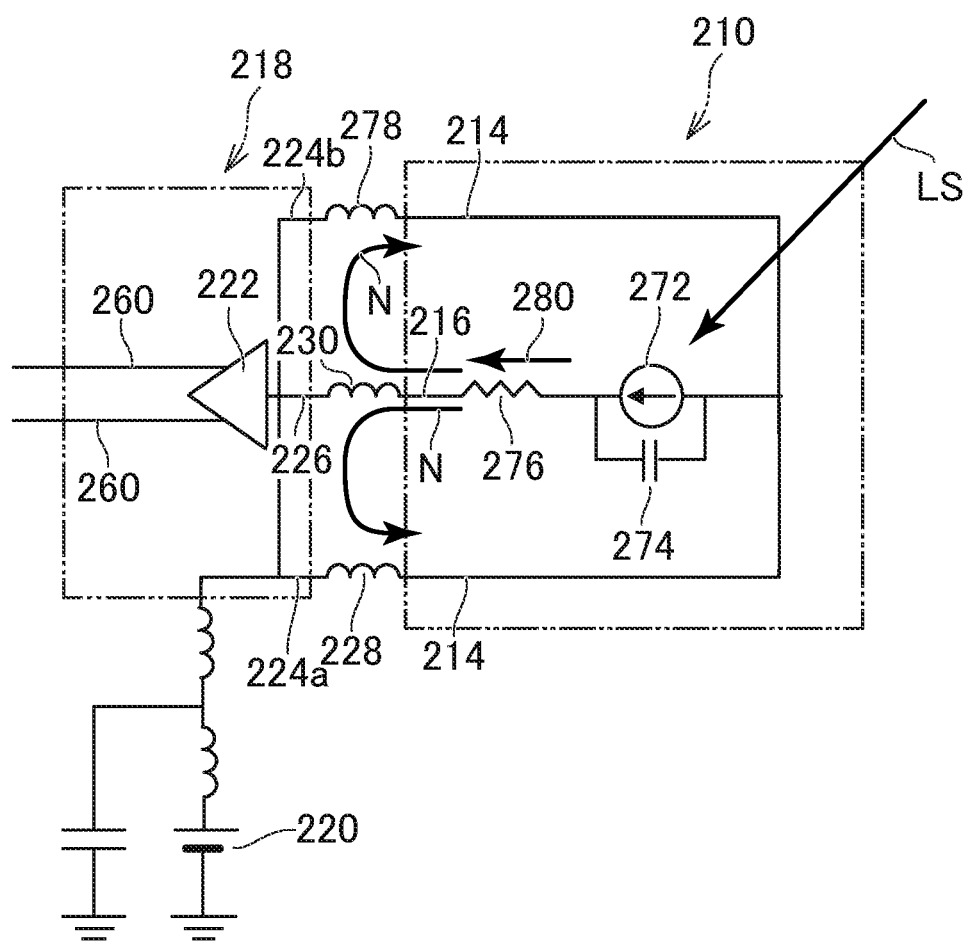
FIG. 5 illustrates an equivalent circuit of the optical receiver module illustrated in FIG. 4.

FIG. 5 illustrates an equivalent circuit of the optical receiver module illustrated in FIG. 4, with structures other than the light receiving element 210 and the amplifier 218 shown simplified. The light receiving element 210 can be considered as an element having a current source 272 for supplying a current in proportional to the light received, an inner capacitance 274, and an inner resistance 276.

The cathode pad 214 and the anode pad 216 of the light receiving element 210 are respectively connected to the first amplifier-side bias pad 224a and the amplifier-side signal pad 226 of the amplifier 218 by the first wire 228 and the second wire 230, respectively. The cathode pad 214 is connected to the second amplifier-side bias pad 224b as well by the third wire 278. The current source 272 receives an input of a bias from an outside power source 220 through the first wire 228, the third wire 278, and the cathode pad 214. A bias line inside the amplifier 218 may often has a filter, for example, which is laid out differently depending on different manufacturers.

Having received an optical signal, the light receiving element 210 generates an electrical signal 280 in proportional to the light received. The electrical signal 280 is inputted through the second wire 230 into the amplifying circuit 222 in the amplifier 218.

Crosstalk is caused in the first wire 228 and the second wire 230 due to mutual inductance and stray capacitance. In particular, a high modulation frequency of the electrical signal 280 leads to a significant crosstalk. That is, subtle crosstalk noise N in accordance with the frequency and size of the electrical signal 280 is caused in the first wire 228 as well. The crosstalk noise N on the first wire 228 propagates through the cathode pad 214 and the current source 272 to be inputted into the amplifying circuit 222. As a result, an electrical signal outputted from the amplifier circuit 222 through the output pad 260 contains many noise components. When the first wire 228 and the second wire 230 are aligned substantially parallel to each other, mutual stray capacitance and mutual inductance become larger. This leads to larger crosstalk noise N on the first wire 228.

Meanwhile, according to this embodiment, as illustrated in FIG. 4, the first wire 228 three-dimensionally intersects, but is not aligned substantially parallel to, the second wire 230. This alignment makes smaller the stray capacitance and mutual inductance between the first wire 228 and the second wire 230, so that crosstalk noise N on the first wire 228 becomes smaller. Other contents are similar to those described in the first reference example.

[Second Embodiment]

Figure 6:
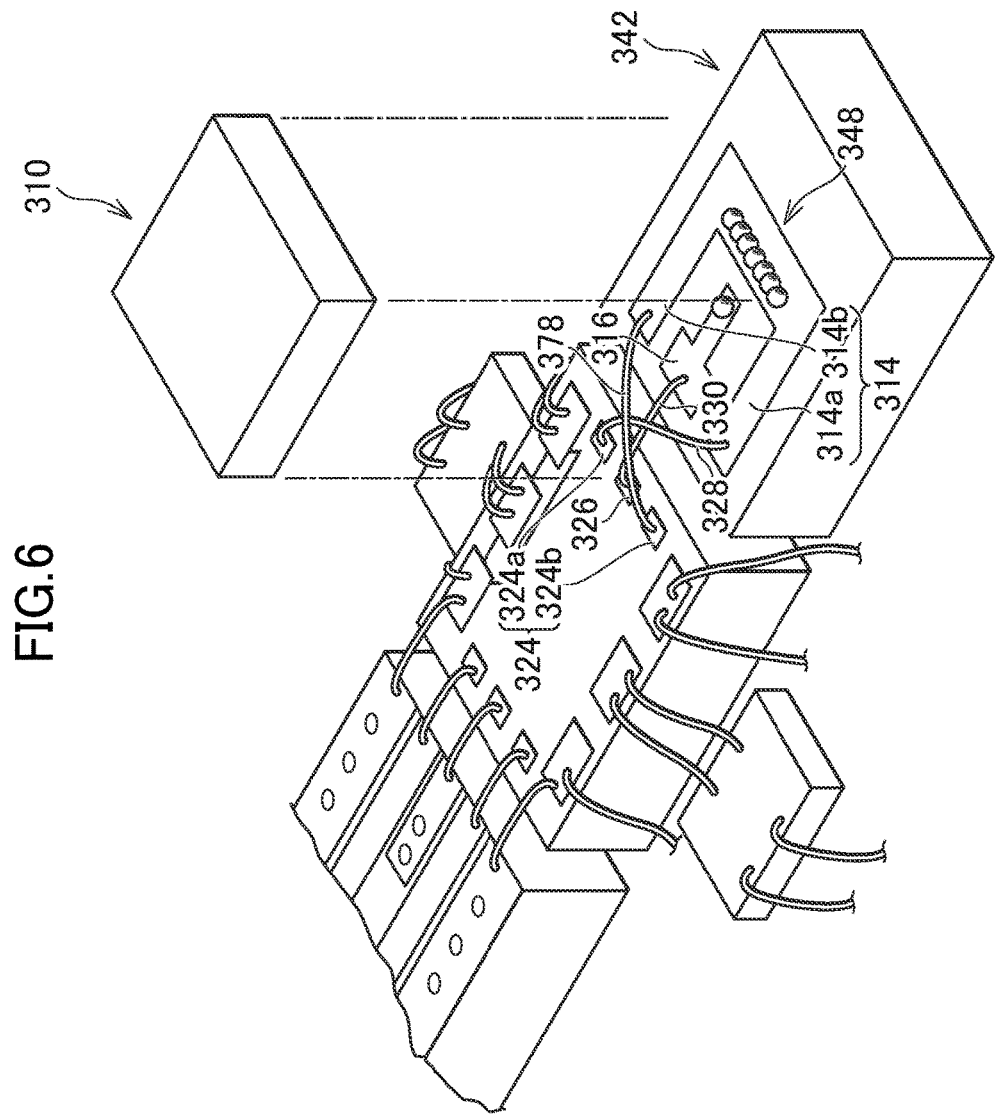
FIG. 6 is a partially exploded perspective view of an optical receiver module according to a second embodiment to which the present invention is applied.

FIG. 6 is a partially exploded perspective view of an optical receiver module according to a second embodiment to which the present invention is applied.

A light receiving element 310 is supported by a carrier 342. The carrier 342 has a wiring pattern 348 electrically connected to the light receiving element 310. The wiring pattern 348 has a cathode pad 314 and an anode pad 316. The carrier 342 is different from the carrier in the first embodiment (FIG. 4) in that the surface thereof where the light receiving element 310 is mounted faces in the same direction as that in which the front surfaces of the cathode pad 314 and the anode pad 316 face.

The cathode pad 314 has a first cathode pad 314a and a second cathode pad 314b. The anode pad 316 is positioned between the first cathode pad 314a and the second cathode pad 314b. An amplifier-side bias pad 324 has a first amplifier-side bias pad 324a and a second amplifier-side bias pad 324b. An amplifier-side signal pad 326 is positioned between the first amplifier-side bias pad 324a and the second amplifier-side bias pad 324b. The first cathode pad 314a is positioned closer to, and adjacent to, the second amplifier-side bias pad 324b than the first amplifier-side bias pad 324a. The second cathode pad 314b is positioned closer to, and adjacent to, the first amplifier-side bias pad 324*a* than the second amplifier-side bias pad 324*b*.

A first wire 328 connects the first cathode pad 314*a* and the first amplifier-side bias pad 324*a* through wire bonding. A second wire 330 connects the anode pad 316 and the amplifier-side signal pad 326 through wire bonding. A third wire 378 connects the second cathode pad 314*b* and the second amplifier-side bias pad 324*b* through wire bonding.

In this embodiment as well, the first wire 328 three-dimensionally intersects with the second wire 330 at an interval in the direction of the loop height of the first wire 328 and the second wire 330. The definition of a loop height is as described in the first embodiment. The third wire 378 three-dimensionally intersects with each of the first wire 328 and the second wire 330 in the direction of the loop height.

In detail, the first wire 328 three-dimensionally intersects with the third wire 378 in any of the direction of the loop height of the first wire 328 and that of the third wire 378. The second wire 330 three-dimensionally intersects with the third wire 378 in any of the direction of the loop height of the second wire 330 and that of the third wire 378. As a result, the first wire 328, the second wire 330, and the third wire 378 three dimensionally intersect with one another at an interval in the respective directions of loop heights.

The direction in which the first wire 328 overlaps (or appears overlapping) the second wire 330 as three-dimensionally intersecting with the second wire 330 is the direction of the loop height of the first wire 328 and also the direction of the loop height of the second wire 330. The direction of the loop height of the first wire 328 and that of the second wire 330 in the direction in which the first wire 328 appears overlapping the second wire 230 may coincide with, be in parallel with, or intersect with each other.

The direction in which the first wire 328 overlaps (or appears overlapping) the third wire 378 as three-dimensionally intersecting with the third wire 378 is the direction of the loop height of the first wire 328 and also the direction of the loop height of the third wire 378. The direction of the loop height of the first wire 328 and that of the third wire 378 in the direction in which the first wire 328 appears overlapping the third wire 378 may coincide with, be in parallel with, or intersect with each other.

The direction in which the second wire 330 overlaps (or appears overlapping) the third wire 378 as three-dimensionally intersecting with the third wire 378 is the direction of the loop height of the second wire 330, and also the direction of the loop height of the third wire 378. The direction of the loop height of the second wire 330 and that of the third wire 378 in the direction in which the second wire 330 appears overlapping the third wire 378 may coincide with, be in parallel with, or intersect with each other.

The direction in which the first wire 328, the second wire 330, and the third wire 378 overlap (or appear overlapping) each other as three-dimensionally intersect with each other is the direction of the loop height of the first wire 328, that of the second wire 330, and that of the third wire 378. The respective directions of the loop heights of the first wire 328, the second wire 330, and the third wire 378 in the direction in which the first wire 328, the second wire 330, and the third wire 378 appear overlapping with each other may all coincide with, be in parallel with, or intersect with each other.

According to this embodiment, the stray capacitance and mutual inductance caused between the first wire 328 and the second wire 330, those between the second wire 330 and the third wire 378, and those between the first wire 328 and the third wire 378 are all small. The small stray capacitance and mutual inductance can reduce crosstalk noise on the first wire 328 and the third wire 378. Note here that although the carrier size and capacitance components may likely become larger in this embodiment, as compared with the first embodiment, by designing a wire pattern, a wire, or the like, such that the inductance component balances with such enlarged carrier size and capacitance component to thereby achieve inductance matching, an optical receiver module superior in high frequency characteristics can be implemented. Other contents are as in the first reference example and the first embodiment.

[Third Embodiment]

Figure 7:
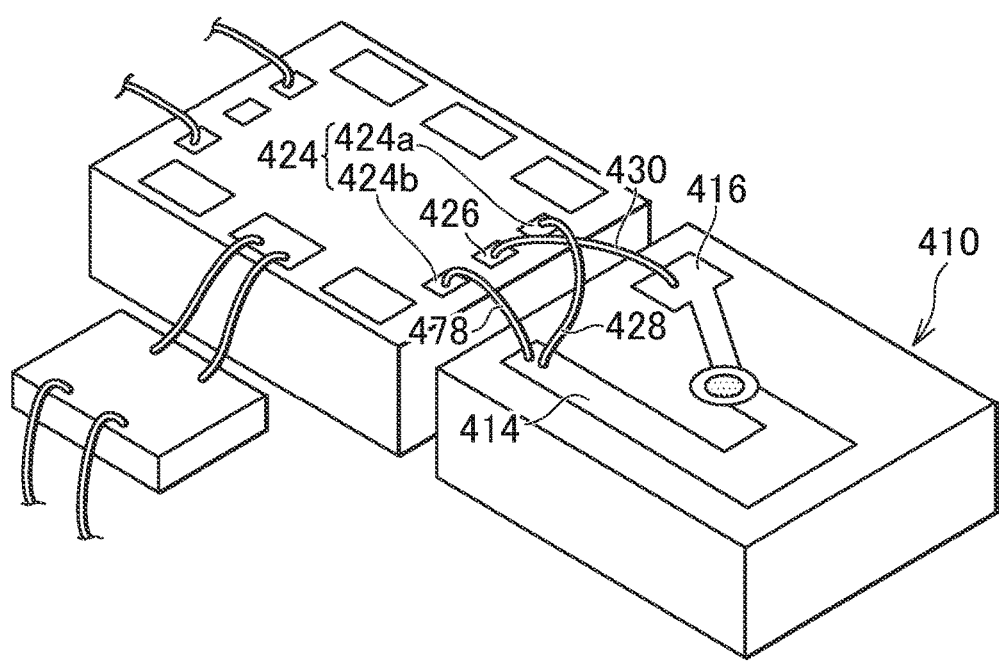
FIG. 7 is a partially exploded perspective view of an optical receiver module according to a third embodiment to which the present invention is applied.

FIG. 7 is a partially exploded perspective view of an optical receiver module according to a third embodiment to which the present invention is applied.

A cathode pad 414 and an anode pad 416 are mounted directly on a light receiving element 410. An amplifier-side bias pad 424 has a first amplifier-side bias pad 424*a* and a second amplifier-side bias pad 424*b*. An amplifier-side signal pad 426 is positioned between the first amplifier-side bias pad 424*a* and the second amplifier-side bias pad 424*b*. The cathode pad 414 is positioned closer to, and adjacent to, the second amplifier-side bias pad 424*b* than the first amplifier-side bias pad 424*a*. The anode pad 416 is positioned closer to, and adjacent to, the first amplifier-side bias pad 424*a* than the amplifier-side signal pad 426.

A first wire 428 connects the cathode pad 414 and the first amplifier-side bias pad 424*a* through wire bonding. A second wire 430 connects the anode pad 416 and the amplifier-side signal pad 426 through wire bonding. A third wire 478 connects the cathode pad 414 and the second amplifier-side bias pad 424*b* through wire bonding. The third wire 478 does not three-dimensionally intersect with either the first wire 428 or the second wire 430 in the loop height direction.

According to this embodiment, the three-dimensional intersection between the first wire 428 and the second wire 430 can reduce crosstalk noise on the first wire 428. Other contents are as in the first reference example and the first and second embodiments. In particular, as an amplifier with three terminals is connected to a carrier with two terminals in this embodiment, as in the first embodiment, this embodiment can achieve the same effect as that in the first embodiment.

[Second Reference Example]

Figure 8:
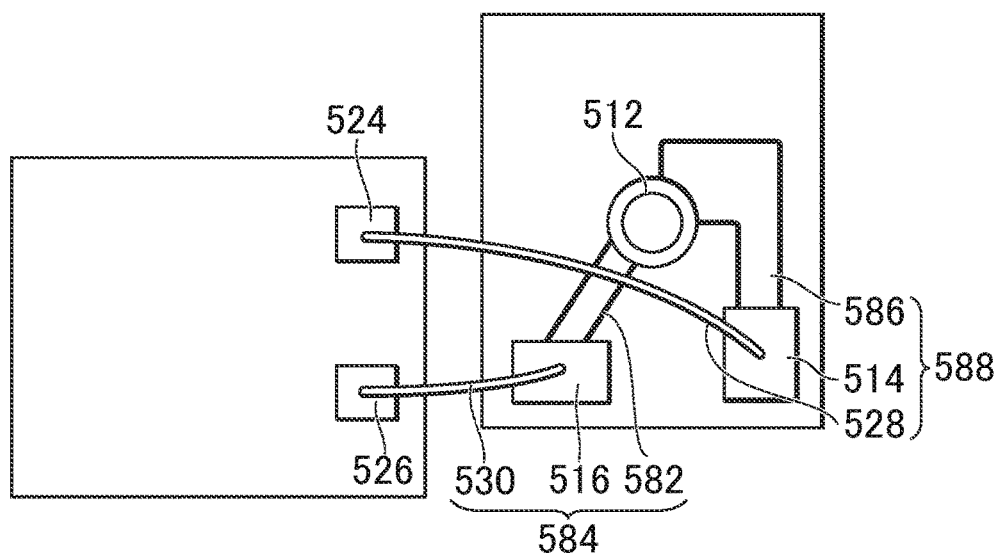
FIG. 8 is a plan view of an optical receiver module according to a second reference example of the present invention.

FIG. 8 is a plan view of an optical receiver module according to a second reference example of the present invention.

The optical receiver module has a signal line 584 extending from a first electrode (anode) of an optical receiver unit 512 via a first line 582 to an amplifier-side signal pad 526. The first line 582 extends to a light receiving element-side signal pad 516. A second wire 530 connects the light receiving element-side signal pad 516 and the amplifier-side signal pad 526.

The optical receiver module has a bias line 588 extending from a second electrode (cathode) of the optical receiver unit 512 via a second line 586 to an amplifier-side bias pad 524. The second line 586 extends to a light receiving element-side bias pad 514. A first wire 528 connects the light receiving element-side bias pad 514 and the amplifier-side bias pad 524.

The signal line 584 three-dimensionally intersects with the bias line 588 at an interval in the direction of the loop height of the first wire 528 and that of the second wire 530. In this example, one of the first wire 528 and the second wire 530 three-dimensionally intersects with a part of the other to which the one is electrically connected. In detail, the first wire 528 three-dimensionally intersects with the first line

582, or a part extending between the first electrode (anode) and the light receiving element-side signal pad 516.

The manner of intersection described in the second reference example can be similarly applied to other embodiments. In an embodiment including a carrier, wiring patterns formed on the carrier so as to be connected to the first and second respective electrodes constitute respective parts of the signal line and the bias line. When either the first wire three-dimensionally intersects with the signal line or the second wire three-dimensionally intersects with the bias line, the effect of the present invention can be obtained.

[Fourth Embodiment]

Figure 9:
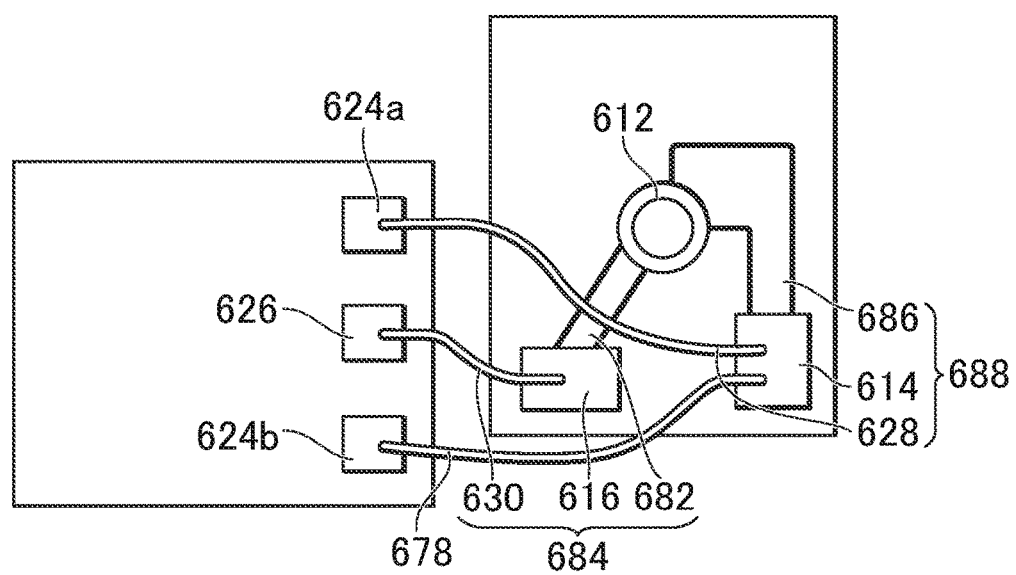
FIG. 9 is a plan view of an optical receiver module according to a fourth embodiment to which the present invention is applied.

FIG. 9 is a plan view of an optical receiver module according to a fourth embodiment to which the present invention is applied.

The optical receiver module has a signal line 684 extending from a first electrode (anode) of an optical receiver unit 612 via a first line 682 to an amplifier-side signal pad 626. The first line 682 extends to an optical receiver element-side signal pad 616. A second wire 630 connects the optical receiver element-side signal pad 616 and the amplifier-side signal pad 626.

The optical receiver module has a bias line 688 extending from a second electrode (cathode) of the optical receiver unit 612 via a second line 686 to a first amplifier-side bias pad 624a. The second line 686 extends to an optical receiver element-side bias pad 614. A first wire 628 connects the optical receiver element-side bias pad 614 and the first amplifier-side bias pad 624a.

The signal line 684 three-dimensionally intersects with the bias line 688 at an interval in the direction of the loop height of the first wire 628 and that of the second wire 630. In this example, one of the first wire 628 and the second wire 630 three-dimensionally intersects with a part of the other to which the one is electrically connected. In detail, the first wire 628 three-dimensionally intersects with the first line 682, or a part extending between the first electrode (anode) and the light receiving element-side signal pad 616.

A third wire 678 connects the optical receiver element-side bias pad 614 and a second amplifier-side bias pad 624b through wire bonding, but does not three-dimensionally intersect when viewed along the direction of the loop height of either the signal line 684 or the bias line 688.

The manner of intersection described in the fourth embodiment can be similarly applied to other embodiments. In an embodiment including a carrier, wiring patterns formed on the carrier so as to be connected to the first and second respective electrodes constitute respective parts of the signal line and the bias line. When either the first wire three-dimensionally intersects with the signal line or the second wire three-dimensionally intersects with the bias line, the effect of the present invention can be obtained. Note that as an amplifier with three terminals is connected to a carrier with two terminals in this embodiment, as in the first embodiment, this embodiment can achieve the same effect as that in the first embodiment.

While there have been described what are at present considered to be certain embodiments of the invention, it will be understood that various modifications may be made thereto, and it is intended that the appended claims cover all such modifications as fall within the true spirit and scope of the invention.

For example, a light receiving element or a light receiving element mounted on a carrier may be mounted on an amplifier. Further, although a single light receiving element is combined with a single amplifier in the above described embodiments, combination between a plurality of light receiving elements and an amplifier having a plurality of sets of bias pads and signal pads, or an array type, is applicable.

What is claimed is:

1. An optical receiver module, comprising:
 a light receiving element having a first electrode and a second electrode for receiving a bias, the light receiving element for converting an optical signal inputted into an electrical signal to output the electrical signal via the first electrode;
 a light receiving element-side signal pad electrically connected to the first electrode of the light receiving element;
 a light receiving element-side bias pad electrically connected to the second electrode of the light receiving element;
 an amplifier for supplying a voltage to apply the bias to the light receiving element and amplifying the electrical signal inputted from the light receiving element;
 a first amplifier-side bias pad and a second amplifier-side bias pad where the voltage appears;
 an amplifier-side signal pad for inputting the electrical signal to the amplifier;
 a first wire connecting the light receiving element-side bias pad and the first amplifier-side bias pad through wire bonding;
 a second wire connecting the light receiving element-side signal pad and the amplifier-side signal pad through wire bonding;
 a third wire connecting the light receiving element-side bias pad and the second amplifier-side bias pad through wire bonding;
 wherein a signal line is formed to extend from the first electrode through the light receiving element-side signal pad and the second wire to the amplifier-side signal pad,
 wherein a bias line is formed to extend from the second electrode through the light receiving element-side bias pad, the first wire, and the third wire to the first amplifier-side bias pad and the second amplifier-side bias pad,
 wherein the first wire three-dimensionally intersects with the second wire at an interval in a direction of a loop height of the first wire and the second wire,
 wherein the amplifier-side signal pad is positioned between the first amplifier-side bias pad and the second amplifier-side bias pad,
 wherein the light receiving element-side bias pad is positioned closer to, and adjacent to, the second amplifier-side bias pad than the first amplifier-side bias pad, and
 wherein the third wire three-dimensionally intersects with neither the first wire nor the second wire in the direction of the loop height.

2. The optical receiver module according to claim 1, wherein the light receiving element-side bias pad, the light receiving element-side signal pad, the first amplifier-side bias pad, the second amplifier-side bias pad, and the amplifier-side signal pad have respective bonding surfaces for bonding to the first wire or the second wire and the third wire, and
 wherein the bonding surfaces all face in a same direction.

3. The optical receiver module according to claim 2, wherein the direction in which the bonding surface faces coincides with the direction of the loop height.

4. The optical receiver module according to claim 1, further comprising:
 a carrier for supporting the light receiving element, wherein the carrier has a wiring pattern electrically connected to the light receiving element, and wherein the wiring pattern includes the light receiving element-side bias pad and the light receiving element-side signal pad.

5. The optical receiver module according to claim 4, wherein the carrier has a first surface facing in a first direction and a second surface facing in a second direction, different from the first surface, and wherein the wiring pattern extends from the first surface to the second surface, and includes the light receiving element-side bias pad and the light receiving element-side signal pad both mounted on the first surface, and an electrical connection portion mounted on the second surface, for electrical connection to the light receiving element.

6. The optical receiver module according to claim 1, wherein the light receiving element-side bias pad and the light receiving element-side signal pad are mounted directly on the light receiving element.

7. An optical module, comprising:

a receiver optical sub-assembly having an optical receiver module including:

a light receiving element having a first electrode and a second electrode for receiving a bias, the light receiving element for converting an optical signal inputted into an electrical signal to output the electrical signal via the first electrode, a light receiving element-side signal pad electrically connected to the first electrode of the light receiving element, a light receiving element-side bias pad electrically connected to the second electrode of the light receiving element, an amplifier for supplying a voltage to apply the bias to the light receiving element and amplifying the electrical signal inputted from the light receiving element;

a first amplifier-side bias pad and a second amplifier-side bias pad where the voltage appears, an amplifier-side signal pad for inputting the electrical signal to the amplifier;

a first wire connecting the light receiving element-side bias pad and the first amplifier-side bias pad through wire bonding, a second wire connecting the light receiving element-side signal pad and the amplifier-side signal pad through wire bonding, and a third wire connecting the light receiving element-side bias pad and the second amplifier-side bias pad through wire bonding; and a transmitter optical sub-assembly for converting an electrical signal inputted into an optical signal to output the optical signal, wherein a signal line is formed to extend from the first electrode through the light receiving element-side signal pad and the second wire to the amplifier-side signal pad, wherein a bias line is formed to extend from the second electrode through the light receiving element-side bias pad, the first wire, and the third wire to the first amplifier-side bias pad and the second amplifier-side bias pad, wherein the first wire three-dimensionally intersects with the bias line at an interval in a direction of a loop height of the first wire and the second wire, wherein the amplifier-side signal pad is positioned between the first amplifier-side bias pad and the second amplifier-side bias pad, wherein the light receiving element-side bias pad is positioned closer to, and adjacent to, the second amplifier-side bias pad than the first amplifier-side bias pad, and wherein the third wire three-dimensionally intersects with neither the first wire nor the second wire in the direction of the loop height.

* * * * *